United States Patent
Jonely et al.

(10) Patent No.: US 9,059,713 B2
(45) Date of Patent: Jun. 16, 2015

(54) CAPACITIVE TOUCH KEYPAD ASSEMBLY

(71) Applicant: Master Lock Company LLC, Oak Creek, WI (US)

(72) Inventors: Michael B. Jonely, Whitewater, WI (US); D. Scott Kalous, Kenosha, WI (US)

(73) Assignee: Master Lock Company LLC, Oak Creek, WI (US)

( * ) Notice: Subject to any disclaimer, the term of this patent is extended or adjusted under 35 U.S.C. 154(b) by 255 days.

(21) Appl. No.: 13/798,315

(22) Filed: Mar. 13, 2013

(65) Prior Publication Data

US 2014/0166462 A1    Jun. 19, 2014

Related U.S. Application Data

(60) Provisional application No. 61/736,739, filed on Dec. 13, 2012.

(51) Int. Cl.
*H01H 9/02* (2006.01)
*H03K 17/96* (2006.01)

(52) U.S. Cl.
CPC ........ *H03K 17/962* (2013.01); *H01H 2215/044* (2013.01); *H01H 2217/018* (2013.01); *H01H 2217/032* (2013.01); *H01H 2219/014* (2013.01); *H01H 2219/0622* (2013.01); *H03K 2217/960755* (2013.01)

(58) Field of Classification Search
CPC ............... H01H 2215/044; H01H 2217/018; H01H 2217/032; H01H 2219/0622; H01H 2219/014; H03K 2217/960755; H03K 17/962
USPC .................. 200/600, 5 A, 6 R; 341/20–26
See application file for complete search history.

(56) References Cited

U.S. PATENT DOCUMENTS

| | | | |
|---|---|---|---|
| 4,766,746 A | | 8/1988 | Henderson et al. |
| 6,723,937 B2 * | | 4/2004 | Englemann et al. .......... 200/600 |
| 8,207,872 B2 * | | 6/2012 | Huang et al. .................... 341/22 |

(Continued)

FOREIGN PATENT DOCUMENTS

WO    2006036950    4/2006

OTHER PUBLICATIONS

Albus, Jack, "PCB-Based Capacitive Touch Sensing with MSP 420," Texas Instruments, Application Report, SLAA363A, Jun. 2007, Revised Oct. 2007, pp. 1-25.

(Continued)

*Primary Examiner* — Edwin A. Leon
(74) *Attorney, Agent, or Firm* — Calfee, Halter & Griswold LLP

(57) ABSTRACT

A capacitive touch keypad assembly includes a housing, a capacitance sensing substrate disposed within the housing, and a plurality of conducting members. The housing includes a barrier panel and a keypad display disposed on an exterior surface of the barrier panel. The keypad display defines a plurality of key locations each aligned with a corresponding bore in the barrier panel. The capacitance sensing substrate includes a plurality of key sensors in alignment with the corresponding plurality of key locations. Each of the plurality of conducting members has a first end disposed in a corresponding one of the plurality of barrier panel bores and a second end engaging a corresponding one of the plurality of key sensors.

21 Claims, 6 Drawing Sheets

(56) References Cited

U.S. PATENT DOCUMENTS

| | | |
|---|---|---|
| 2007/0103451 A1 | 5/2007 | Heimann et al. |
| 2007/0115263 A1 | 5/2007 | Taylor et al. |
| 2010/0309030 A1 | 12/2010 | Huang et al. |
| 2010/0319470 A1 | 12/2010 | Wehrle et al. |
| 2013/0114195 A1* | 5/2013 | Lee et al. ............ 361/679.01 |

OTHER PUBLICATIONS

Atmel, QTAN0079 Buttons, Sliders and Wheels, Sensor Design Guide, 10752A-AT42, Aug. 20, 2011, 70 pages.

International Search Report and Written Opinion from International Application No. PCT/US13/74928, date of mailing Apr. 21, 2014.

* cited by examiner

CAPACITIVE TOUCH KEYPAD ASSEMBLY

CROSS-REFERENCE TO RELATED APPLICATION

This application claims priority to and the benefit of U.S. Provisional Patent Application Ser. No. 61/736,739, entitled "CAPACITIVE TOUCH KEYPAD ASSEMBLY" and filed Dec. 13, 2012, the entire disclosure of which is incorporated herein by reference.

BACKGROUND

Electronic keypads are used with a variety of electronic and electromechanical devices, for example, for transmitting access codes, inputting information, or prompting one or more operations of the device. In one exemplary embodiment, a keypad includes a set of individual electrical switch actuating buttons depressible to communicate a data signal corresponding to the pressed button. In another embodiment, referred to as a capacitive touch keypad, a PC board disposed under a touch pad includes a set of capacitance sensors or capacitors associated with key locations on the touch pad. User contact with the touchpad using a conductive element (e.g., the user's finger) at one of the key locations causes the corresponding capacitance sensor to detect a change in capacitance caused by interference in the conductive field resulting from the conductive element contact.

SUMMARY

According to an exemplary embodiment of the present application, a capacitive touch keypad assembly includes a housing, a capacitance sensing substrate disposed within the housing, and a plurality of conducting members. The housing includes a barrier panel and a keypad display disposed on an exterior surface of the barrier panel. The keypad display defines a plurality of key locations each aligned with a corresponding bore in the barrier panel. The capacitance sensing substrate includes a plurality of key sensors in alignment with the corresponding plurality of key locations. Each of the plurality of conducting members has a first end disposed in a corresponding one of the plurality of barrier panel bores and a second end engaging a corresponding one of the plurality of key sensors on the capacitance sensing substrate.

According to another exemplary embodiment of the present application, a keypad operated device includes a housing, a PC board disposed within the housing, a plurality of conducting members, and a microprocessor disposed in the housing and electrically connected with the PC board. The housing includes a barrier panel and a keypad display disposed on an exterior surface of the barrier panel. The keypad display defines a plurality of key locations each aligned with a corresponding bore in the barrier panel. The PC board includes a plurality of key sensors in alignment with the corresponding plurality of key locations. Each of the plurality of conducting members has a first end disposed in a corresponding one of the plurality of barrier panel bores and a second end engaging a corresponding one of the plurality of key sensors. The microprocessor is in electronic communication with each of the plurality of key sensors and is configured to measure changes in capacitance at each of the plurality of key sensors corresponding to user contact with a corresponding one of the plurality of key locations.

According to still another exemplary embodiment, a capacitive touch keypad assembly includes a housing including a conductive barrier panel and a keypad display disposed on an exterior surface of the barrier panel. The keypad display defines a plurality of key locations each aligned with a corresponding bore in the barrier panel. The keypad assembly further includes a plurality of conducting members each having a first end disposed in a corresponding one of the plurality of barrier panel bores, and a plurality of nonconductive insulating members each disposed in a corresponding one of the plurality of bores and separating the corresponding conducting member from an internal surface of the corresponding bore. The keypad assembly further includes a means for detecting a change in capacitance between the barrier panel and each of the plurality of conducting members in response to user contact with the corresponding key location.

BRIEF DESCRIPTION OF THE DRAWINGS

Further features and advantages of the invention will become apparent from the following detailed description made with reference to the accompanying drawings, wherein.

DETAILED DESCRIPTION

The Detailed Description merely describes exemplary embodiments is not intended to limit the scope of the claims in any way. Indeed, the invention as claimed by the specification is broader than and unlimited by the exemplary embodiments, and the terms used in the claims have their full ordinary meaning.

Also, while the present application describes an exemplary capacitive touch keypad for an electronic padlock, one or more of the features described herein may additionally or alternatively be applied to virtually any fixed or portable electronic keypad operated devices, including, for example, consumer appliances, industrial equipment, door locks, elevators, wall safes, ATM machines and other public kiosks, medical devices, and vehicle locks and control panels.

A conventional capacitive touch keypad includes an external, nonconductive panel (e.g., plastic, glass) having discrete surface indicia corresponding to one or more user selectable "keys" of the keypad. The external panel overlies a printed circuit board (PCB) including one or more open capacitors aligned with the corresponding keypad keys. When the user contacts a selected key with a conductive element (e.g., the user's finger, a conductive finger covering, or a conductive stylus), this contact interferes with an electrical field surrounding the corresponding capacitor, such that a capacitance measured by the capacitor microprocessor deviates from a base capacitance (e.g., less than 10 pF) corresponding to the electrical field absent such contact. Due to maximum thickness limitations (e.g., about ⅛ inch) of the external panel to maintain sufficient electrical field interference in response to user contact, and/or material limitations to maintain a non-conductive layer over the PC board, the PC board and its components may be vulnerable to damage caused by rough use, intentional abuse, and vandalism. This type of damage may be of particular concern for devices and equipment commonly used in public settings, including, for example, ATM machines, vending machines, computer-based kiosks (e.g., digital photograph processing kiosks), and electronic door locks. While abuse of a keypad is generally ineffective to obtain unauthorized access to or use of a device or enclosure, the resulting damage can render the keypad inoperable.

Figure 1:
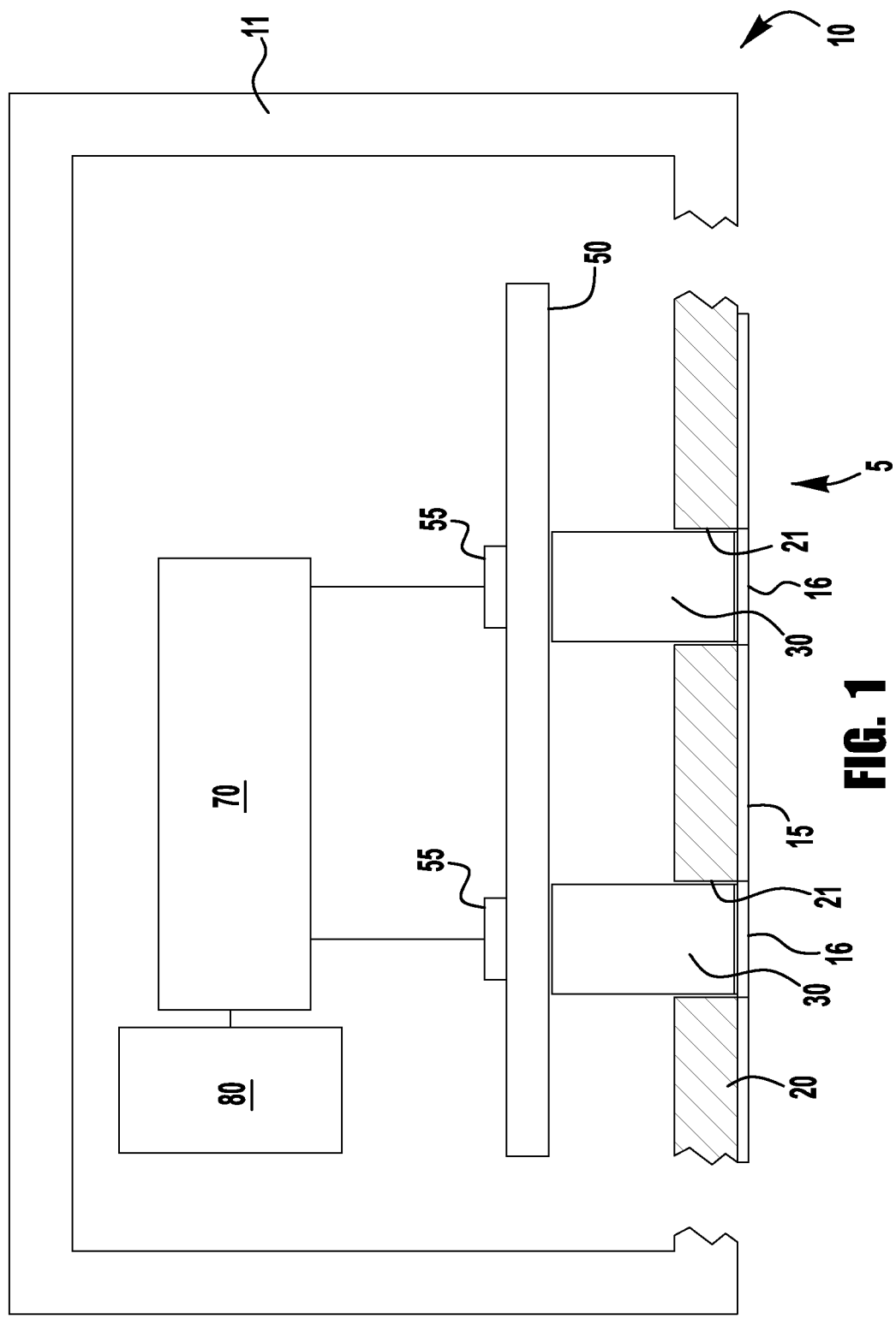
FIG. 1 illustrates a cross-sectional schematic view of a capacitive touch keypad assembly, in accordance with an exemplary embodiment.
Figure 2:
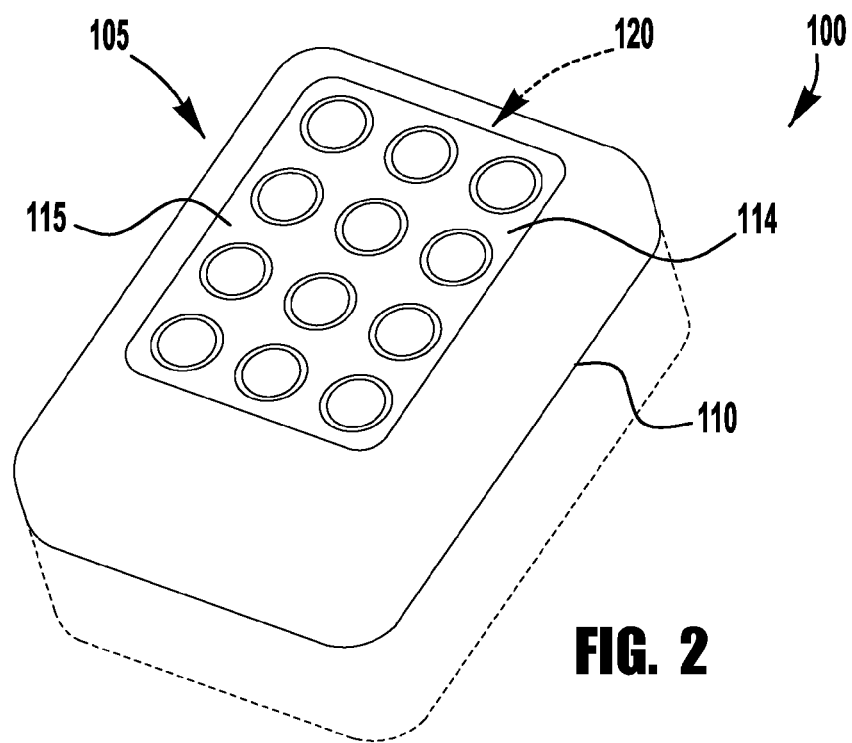
FIG. 2 illustrates a front perspective view of a capacitive touch keypad assembly, in accordance with another exemplary embodiment.
Figure 3:
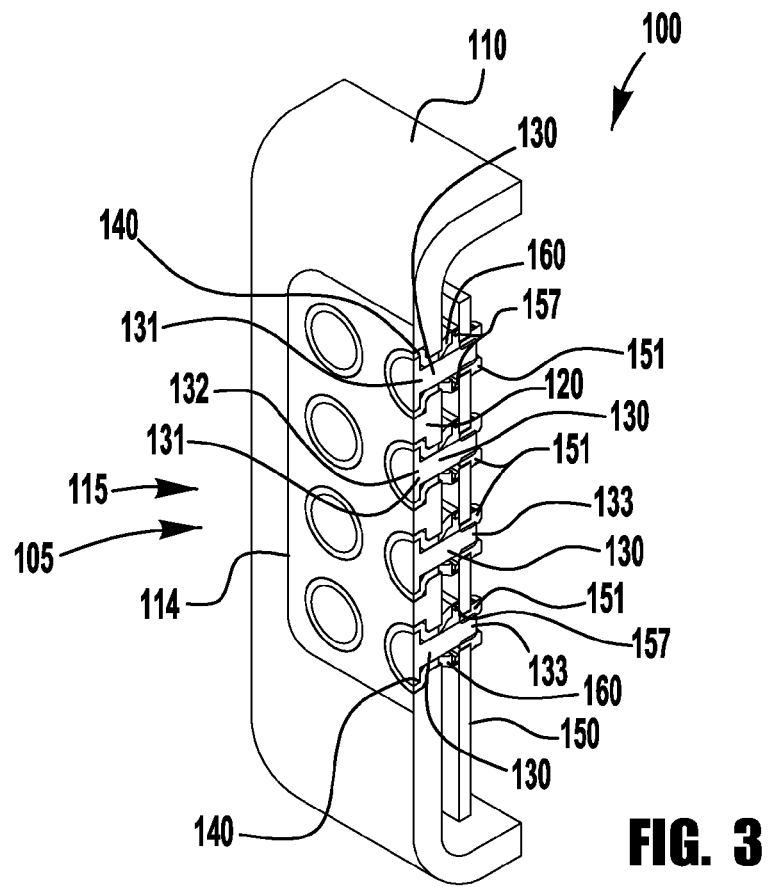
FIG. 3 illustrates a side perspective cross-sectional view of the keypad assembly of FIG. 2.
Figure 4:
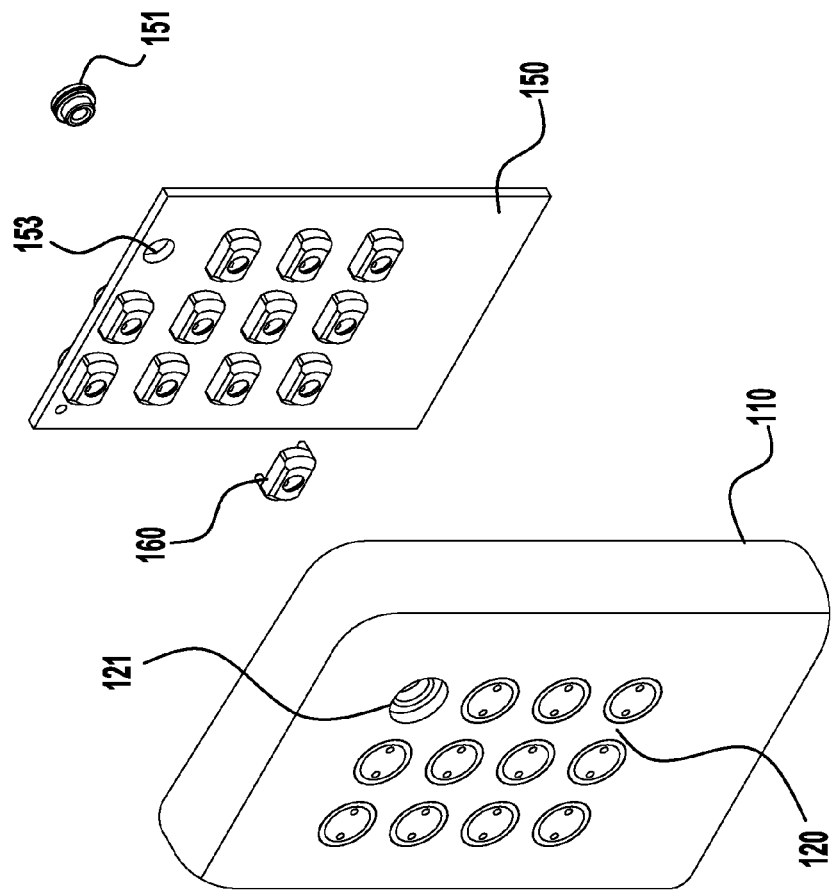
FIG. 4 illustrates a partially exploded perspective view of the keypad assembly of FIG. 2.
Figure 5:
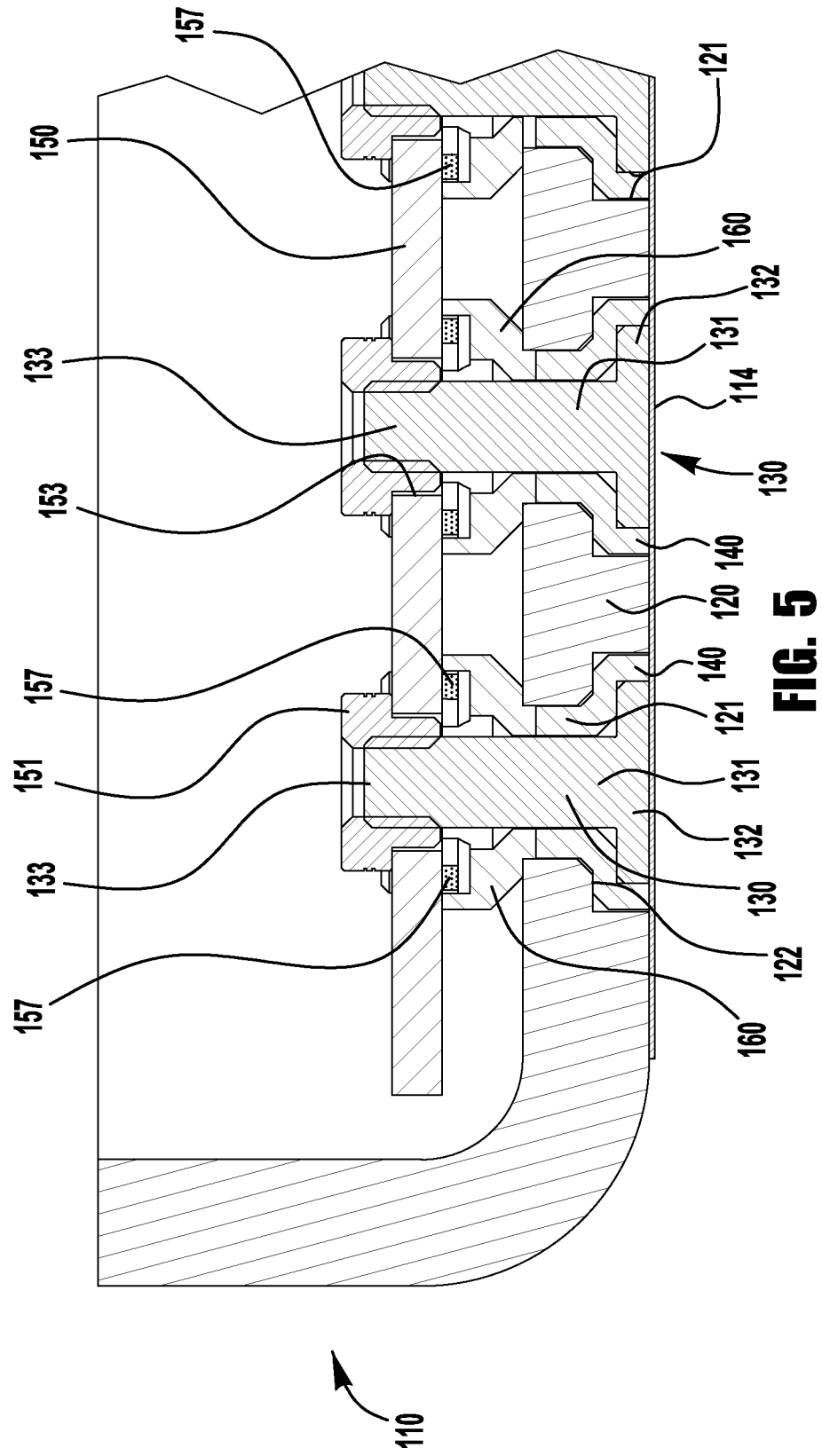
FIG. 5 illustrates a partial side cross-sectional view of the keypad assembly of FIG. 2.

According to an aspect of the present application, as schematically shown in FIG. 1, a device 10 having a capacitive touch keypad 5 may be configured such that one or more internal keypad components are protected from damage due to accidental or malicious impacts to a key surface of the keypad. In one embodiment, a device having a capacitive touch keypad includes a barrier panel or plate 20 disposed between an external key surface 15 and an internal capacitance sensing substrate 50 (e.g., a PC board) in communication with a microprocessor 70 (which may be powered by a battery 80 within the device housing 11, or may be disposed outside of the housing or powered by a power source external to the housing). User contact with a selected key location 16 on the key surface 15 causes a change in the capacitance between a conductive portion of the device (e.g., the housing 11) and an underlying conducting member 30 associated with the key location 16 and electrically connected with a key sensor 55 (e.g., a conductive pad, insert, or other such electrode) on the substrate 50. This change in capacitance is communicated to and measured by the microprocessor 70 to identify the key selection by the user. In one embodiment, the barrier panel has a thickness that is greater than a thickness through which user contact would produce a measurable variance in the capacitance at the PC board mounted capacitor corresponding with the user selected key location. In another embodiment, the barrier panel is additionally or alternatively provided in a durable, impact resistant material, which may, but need not, be an electrically conductive material.

To permit measurable interference of an electrical field across the barrier panel in response to contact by a conductive element with a selected external key surface, according to an aspect of the present application, the capacitive touch keypad operated device may be provided with one or more conducting members 30 extending from a corresponding key location 16, through the barrier panel (e.g., through a barrier panel bore 21 and toward a corresponding key sensor or electrode on the substrate 50). The conducting members 30 extending toward the substrate 50 effectively extend the reach of the interference effect on the corresponding key sensor 55 in response to user applied contact with the selected key location 16. In one embodiment, the conducting member is electrically connected with the substrate. In another embodiment, the conducting member is additionally or alternatively mechanically connected with the substrate. In one such exemplary embodiment, the substrate is mounted within the device by mechanical connections between the substrate and one or more conducting members and mechanical connections between the one or more conducting members and the barrier panel.

Many different types of conducting members may be utilized to extend conductance between the external key surfaces and the capacitance sensing substrate. In one example, a conductive key pin is assembled with the barrier panel, such that a first end of the key pin is positioned on or adjacent to the key surface, and a second end extends through an opening in the barrier panel toward the capacitance sensing substrate, with the second end of the key pin being directly or indirectly connected with the capacitance sensing substrate. As used herein, a key pin may include any shape member sized to extend through a barrier panel toward an internal capacitance sensing substrate of the device, including, for example, cylindrical, conical, tubular, plate-like, or square, rectangular, elliptical or any other cross-sectional shape.

FIGS. 2-5 illustrate various views of an exemplary device 100 operated by a capacitive touch keypad assembly 105, in accordance with certain aspects of the present application. The device 100 may include any of a variety of portable or fixed devices operable by use of the keypad assembly 105, for example, to obtain access, transmit information, or select one or more operative functions of the device 100. The device 100 includes an outer housing 110 defining a barrier panel 120 on which a keypad display 115 is disposed. In other embodiments (not shown), the barrier panel may be provided as a separate component assembled with or disposed within the housing.

The barrier panel includes a series of openings 121 corresponding to a series of key positions on the keypad display 115. Conductive key pins 130 or other such conducting members extend through each of the openings 121, such that a first end 131 of each key pin 130 is disposed on or adjacent to the key surface, and a second end 133 of each key pin 130 extends toward a PC board 150 or other such substrate disposed within the housing 110. The keypad display 115 includes indicia corresponding to one or more discrete key locations, aligned with the corresponding key pin first ends 131. While the first ends 131 of the key pins 130 may themselves define at least a portion of the key surface (e.g., with a painted, etched, anodized or coated outer surface), in the illustrated embodiment, the keypad display 115 is provided on a thin, non-conductive overlay 114 (e.g., a thin plastic sheet overlay) secured to the external surface of the barrier panel 120. As shown, the overlay 114 may include slots, perforations or other such features to delineate the individual keys.

As shown in the exemplary embodiment, the first end 131 of each key pin 130 may include an enlarged head portion 132 that is seated in a corresponding counterbore 122 surrounding the corresponding opening 121. Engagement of the head portion 132 with the counterbore 122 provides a mechanical connection between the key pins 130 and the barrier panel 120, and may prevent the key pin from being driven further into the housing 110 due to impacts (malicious or otherwise) against the first end 131 of the key pin 130.

To enable use of a conductive barrier panel (e.g., to allow for use of high strength metals, for example, steel or aluminum), each key pin may be insulated from the barrier panel by a nonconductive insulating member (e.g., a bushing, plug, sealant, coating, or other such element). In the illustrated embodiment, a non-conductive insulator bushing 140 is seated between the barrier panel counterbore 122 and the key pin head portion 132. The head portion 132 and bushing 140 may be sized to minimize the peripheral gap between the head portion 132 and the edge of the counterbore 122, for example, to impede efforts to pry out the key pin 130, while sufficiently insulating the key pin 130 from the barrier panel 120 to prevent dissipation of any electrical field interfering effects of user contact with the corresponding keypad display.

Many different types of arrangements may be utilized to electrically and/or mechanically connect the key pin 130 to a key sensor location on the PC board 150, including, for example, threaded connections, press-fit or snap-fit connections (e.g., with a plated hole or soldered bushing on the PC board), soldering to the PC board, abutment between the second or innermost end of the key pin and a conductive pad on the PC board, or a wired connection between the key pin and a conductive key sensor location on the PC board. In the illustrated example, the second end 133 of each key pin 130 includes a threaded portion for mating threaded engagement with a threaded conductive (e.g., metal, such as brass) key sensor insert 151 surface mounted (e.g., by an adhesive, sealant, press-fit engagement, or soldering) in an aperture 153 aligned with the barrier panel opening 121, to provide both an electrical connection and a mechanical mount of the PC board 150 to the key pins 130. The head portion 132 of the key pin 130 may be provided with spanner-type holes or other tool engagement features to facilitate threaded installation of the key pins 130, while impeding efforts to disassemble or otherwise tamper with the key pins. In another exemplary embodiment (not shown), the key pin may be knurled and press fit into a plated hole in the PC board. The PC board 150 may include any suitable type of circuit board, including, for example, an FR4 (flame resistant glass-reinforced epoxy laminate) circuit board or flex circuit board. A potting compound (not shown) may be provided around the PC board 150, for example, to provide moisture and shock resistance.

In the exemplary embodiment, the electrical connection of the key pins 130 with the PC board 150 enables each key pin 130 to function, in combination with the metal housing 110, as a capacitor configured to detect deviations in a base capacitance corresponding to interference in an electrical field caused by user contact with the key pin (e.g., directly or through an overlay). In such an arrangement, the housing 110 functions as a first capacitor "plate" and each key pin 130 functions as a second capacitor "plate," accumulating stray capacitance. Each key pin 130 is electrically connected, via the PC board 150 and the corresponding key sensor insert 151, to a microprocessor (not shown) powered by a battery (not shown) or other such power source, for detecting and evaluating the user selected keypad entries.

Many conventional keypad assemblies use piezo transducers that detect vibrations through an outer metal plate, which requires that this plate be sufficiently thin to propagate detectable vibrations. In the exemplary embodiment described herein, the barrier panel 120 may be provided with a thickness sufficient to protect the internal keypad components from damage caused by impacts to the keypad. In exemplary embodiments, the barrier panel may have a thickness of approximately 0.188 inches. In other embodiments, thinner or even thicker panels may be used, for example, panels having a thickness of approximately ⅛ inch to approximately ¼ inch, approximately ¼ inch to approximately ⅜ inch, approximately ⅜ inch to approximately ½ inch, or greater than ½ inch.

In devices utilizing a capacitive touch keypad, it may be desirable to provide user feedback to confirm that the selected key contact has been detected. Exemplary feedback may include light indicators or audible tones. In one embodiment, a light indicator may be associated with each key of the keypad, to provide visual confirmation of the specific key selected (e.g., replacing the tactile feel of a depressed button/switch). As one example, each key location on the keypad may be selectively backlit by one or more light emitting diodes (LEDs) that are selectively powered when contact with the corresponding key location is detected. In the illustrated embodiment of FIGS. 2-5, LEDs 157 are secured to the PC board 150 proximate to each aperture 153 and in electrical communication with the device microprocessor for powered illumination (e.g., powered by internal battery in device, not shown) in response to microprocessor receipt of electrical signals from the corresponding capacitor.

The backlighting illumination may be transmitted to the key surface of the keypad assembly using any suitable arrangement. In the illustrated embodiment, the insulator bushings 140 may include a transparent or translucent material, such that light emitted from the LEDs 157 may be transmitted through the bushings 140. To more effectively direct the emitted light toward the bushings, LED light pipes 160 may be installed onto the front surface of the PC board 150 around the PC board openings 153 (e.g., by snap fit engagement of a light pipe pin extension 168 with a corresponding hole 158 in the PC board 150), with any potting compound kept away from the light transmission path formed by the light pipe 160 and bushing 140. The light pipes 160 may also server as spacers between the barrier panel 120 and the PC board 150, to minimize stresses to the PC board resulting from pulling tension on the key pins 130.

In assembling the capacitive touch keypad assembly 105 of the illustrated embodiment, the key pins 130 (assembled with insulator bushings 140) are inserted through the barrier panel openings 121 from the front of the barrier panel 120, such that the head portions 132 of the key pins 130 and insulator bushings 140 are seated in the counterbores 122 surrounding the barrier panel openings. The key pins 130 are then rotated within the barrier panel openings 121 (e.g., by a tool that engages holes 136 in the head portion 132 of the key pin 130, or any other suitable arrangement) to threadingly engage the second end 133 of the key pins with the corresponding PC board inserts 151, thereby electrically and mechanically connecting the key pins 130 with the PC board 150, and securing the PC board within the device 100. In another embodiment (not shown), a capacitive touch keypad assembly may be provided without seating engagement between key pin head portions and barrier panel openings, such that the key pins may be assembled with the PC board prior to installation in the device by inserting the key pins through the barrier panel openings from inside the device.

While the components of the capacitive touch keypad assembly 105 may be provided in any suitable material, in an exemplary embodiment, the barrier panel 120/housing 110 are provided in steel or aluminum, the key pins 130 are provided in steel, the insulator bushings 140 are provided in plastic (e.g., polycarbonate), the PC board is provided in FR4, the PC board inserts 151 are provided in brass, the LED light pipes 160 are provided in plastic (e.g., polycarbonate), and the graphic overlay is provided in plastic (e.g., polyester or polycarbonate).

Figure 6:
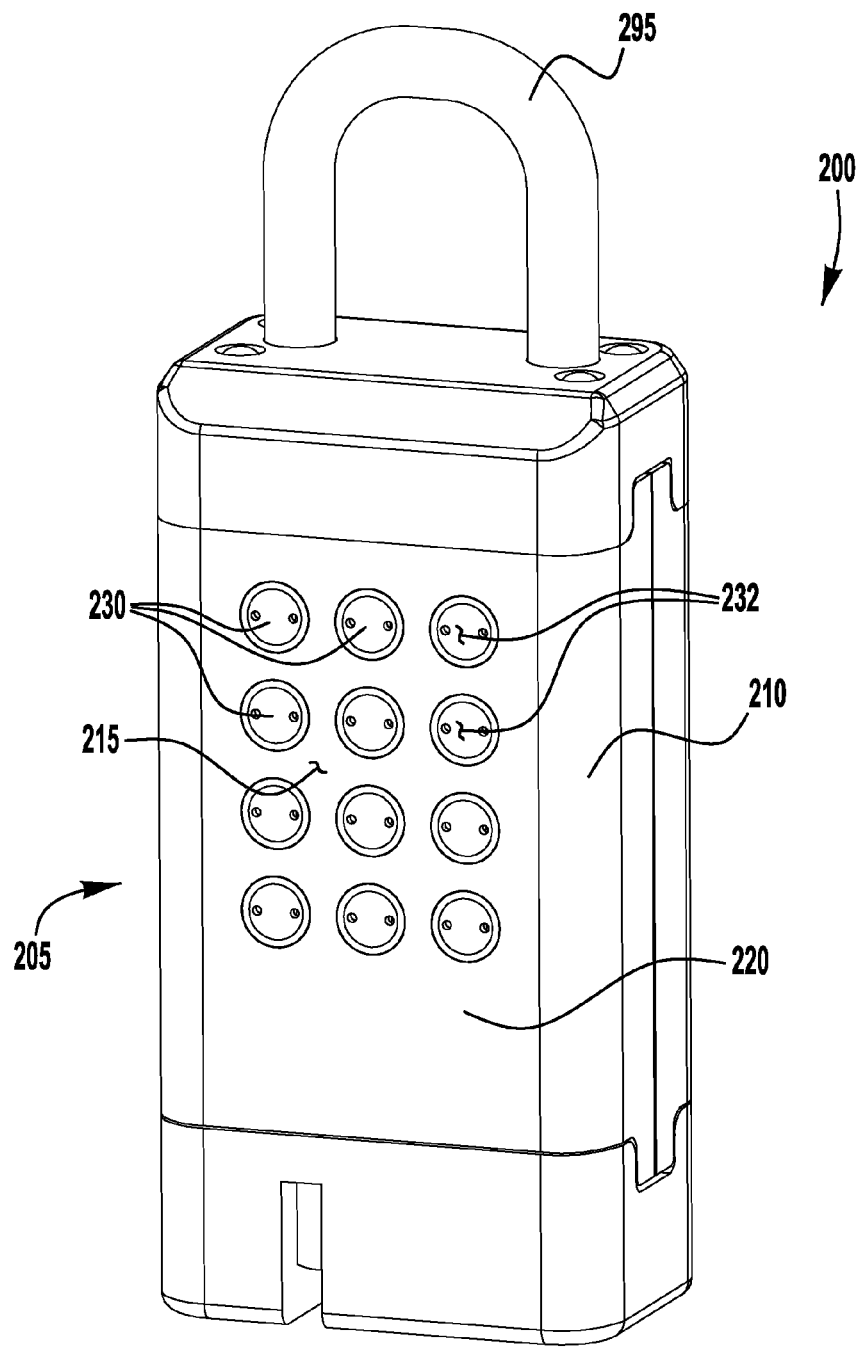
FIG. 6 illustrates a front perspective view of an electronic padlock with a keypad assembly, in accordance with an exemplary embodiment.
Figure 7:
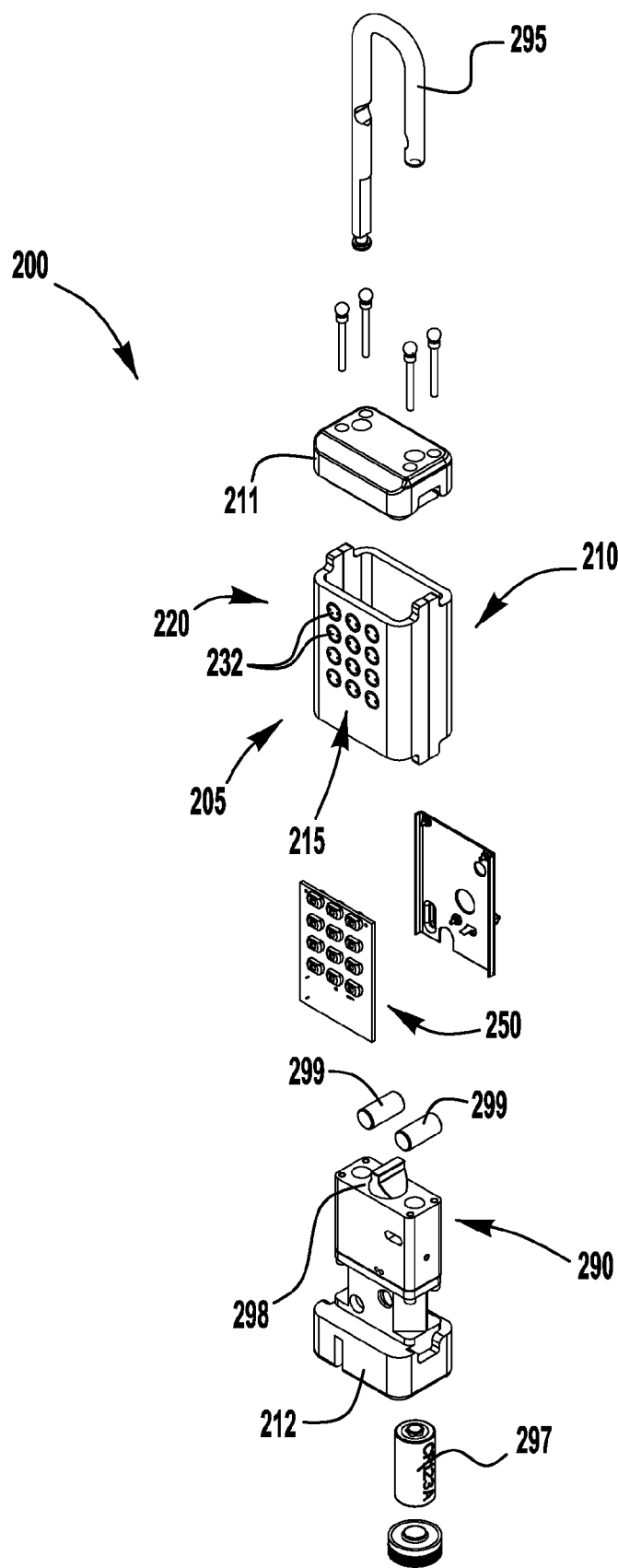
FIG. 7 illustrates a front perspective view of the electronic padlock of FIG. 6.

Capacitive touch keypad assemblies including one or more of the features described herein may be utilized with a variety of devices, including, for example, an access code restricted door lock, padlock, elevator, ATM machine, and other such devices. The device may be a separate keypad code entry device, electrically transmitting (e.g., by wired or wireless transmission) authorization signals to another device. Alternatively, an access code restricted device may include an integral keypad assembly for authorized operation of an electronic or electromechanical mechanism, such as, for example, a padlock. FIGS. 6 and 7 illustrate an exemplary electronic padlock 200 with capacitive touch keypad assembly 205, including a lock body housing 210, assembled with upper and lower body members 211, 212 and defining a barrier panel portion 220 on which the key surface 215, defined in part by head portions 232 of conductive key pins 230, is disposed. The capacitive touch keypad assembly 205 of the exemplary padlock 200 may, but need not, be substantially similar to the keypad assembly 105 of the exemplary device 100 of FIGS. 2-5. The exemplary padlock 200 includes a microprocessor (not shown) in electronic communication with a PC board 250 for measuring changes in capacitance cause by user contact with selected key locations, and for evaluating detected keypad entries for comparison with one or more authorized access codes stored in the microprocessor. An electromechanical locking mechanism 290 (with a sliding blocker 298 and shackle engaging locking members 299) is powered by an internal battery electrically connected with the microprocessor, which delivers an authorization signal to the locking mechanism 290 to actuate the locking mechanism from a locked condition to an unlocked condition. When the locking mechanism is in the unlocked condition, the padlock shackle 295 is movable from a locked or closed position to an unlocked or open position.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure; however, such values and ranges are not to be construed in a limiting sense and are intended to be critical values or ranges only if so expressly stated. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention. Descriptions of exemplary methods or processes are not limited to inclusion of all steps as being required in all cases, nor is the order that the steps are presented to be construed as required or necessary unless expressly so stated.

We claim:

1. A capacitive touch keypad assembly comprising:
   a housing including a barrier panel and a keypad display disposed on an exterior surface of the barrier panel, the keypad display defining a plurality of key locations each aligned with a corresponding axially extending bore in the barrier panel;
   a capacitance sensing substrate disposed within the housing and including a plurality of key sensors in alignment with the corresponding plurality of key locations; and
   a plurality of electrically conductive members each having a first end axially fixed within a corresponding one of the plurality of barrier panel bores and a second end engaging a corresponding one of the plurality of key sensors.

2. The keypad assembly of claim 1, wherein the keypad display is disposed on a nonconductive overlay sheet secured to an outer surface of the barrier panel.

3. The keypad assembly of claim 1, further comprising a plurality of insulating members each disposed in a corresponding one of the plurality of bores and separating the corresponding electrically conductive member from an internal surface of the corresponding bore, wherein each of the plurality of insulating members comprises a nonconductive material, and the barrier panel comprises a conductive material.

4. The keypad assembly of claim 3, wherein each of the plurality of insulating members comprises a plastic bushing.

5. The keypad assembly of claim 3, wherein the barrier panel functions as a first capacitor plate and each of the electrically conductive members functions as a second capacitor plate for generating a measurable change in capacitance at the corresponding key sensor in response to user contact with the corresponding key location.

6. The keypad assembly of claim 1, wherein the barrier panel has a thickness of at least approximately 0.188 inches.

7. The keypad assembly of claim 1, wherein the first end of each of the plurality of electrically conductive members includes an enlarged head portion seated in a counterbore of the corresponding barrier panel bore.

8. The keypad assembly of claim 1, wherein the second end of each of the plurality of electrically conductive members is threadingly engaged with the corresponding key sensor.

9. The keypad assembly of claim 1, wherein the capacitance sensing substrate comprises a PC board, and each of the plurality of key sensors comprises an electrode secured to the PC board and electrically connected with the second end of the corresponding electrically conductive member.

10. The keypad assembly of claim 9, wherein the electrode of each of the plurality of key sensors includes a threaded insert secured in an aperture in the PC board for threaded engagement with the second end of the corresponding electrically conductive member.

11. The keypad assembly of claim 9 further comprising a plurality of light emitting diodes each secured to the PC board proximate a corresponding one of the plurality of key sensors and configured to provide powered illumination in response to detection of a change in capacitance at the corresponding key sensor.

12. The keypad assembly of claim 11, further comprising a plurality of light pipes each assembled around a corresponding one of the plurality of electrically conductive members and configured to direct light from the corresponding light emitting diode through the corresponding bore and toward the key display.

13. The keypad assembly of claim 1, further comprising a microprocessor disposed within the housing and electrically connected with the capacitance sensing substrate, wherein the microprocessor is in electronic communication with each of the plurality of key sensors and is configured to measure changes in capacitance at each of the plurality of key sensors, corresponding to user contact with a corresponding one of the plurality of key locations.

14. The keypad assembly of claim 1, wherein the housing comprises an exterior shell enclosing the capacitance sensing substrate, the barrier panel being integral with the exterior shell.

15. A keypad operated device comprising:
   a housing including a barrier panel and a keypad display disposed on an exterior surface of the barrier panel, the keypad display defining a plurality of key locations each aligned with a corresponding axially extending bore in the barrier panel;

a PC board disposed within the housing and including a plurality of key sensors in alignment with the corresponding plurality of key locations;

a plurality of electrically conductive members each having a first end axially fixed within a corresponding one of the plurality of barrier panel bores and a second end engaging a corresponding one of the plurality of key sensors; and a microprocessor disposed within the housing and in electronic communication with each of the plurality of key sensors, the microprocessor being configured to measure changes in capacitance at each of the plurality of key sensors corresponding to user contact with a corresponding one of the plurality of key locations.

16. The keypad operated device of claim 15, further comprising an electromechanical locking mechanism electrically connected with the microprocessor and movable from a locked condition to an unlocked condition in response to an authorization signal delivered from the microprocessor to the locking mechanism.

17. The keypad operated device of claim 16, further comprising a shackle assembled with the housing and movable from a locked position to an unlocked position when the electromechanical locking mechanism is moved to the unlocked condition.

18. The keypad operated device of claim 15, further comprising a plurality of insulating members each disposed in a corresponding one of the plurality of bores and separating the corresponding electrically conductive member from an internal surface of the corresponding bore, wherein each of the plurality of insulating members comprises a nonconductive material, and the barrier panel comprises a conductive material.

19. The keypad operated device of claim 18, wherein the barrier panel functions as a first capacitor plate and each of the electrically conductive members functions as a second capacitor plate for generating a measurable change in capacitance at the corresponding key sensor in response to user contact with the corresponding key location.

20. The keypad operated device of claim 15, wherein the microprocessor is further configured to evaluate keypad entries for comparison with an authorized access code stored in the microprocessor.

21. A capacitive touch keypad assembly comprising:

a housing including a conductive barrier panel and a keypad display disposed on an exterior surface of the barrier panel, the keypad display defining a plurality of key locations each aligned with a corresponding axially extending bore in the barrier panel;

a plurality of electrically conductive members each having a first end axially fixed within a corresponding one of the plurality of barrier panel bores;

a plurality of nonconductive insulating members each disposed in a corresponding one of the plurality of bores and separating the corresponding electrically conductive member from an internal surface of the corresponding bore; and means for detecting a change in capacitance between the barrier panel and each of the plurality of electrically conductive members in response to user contact with the corresponding key location.

* * * * *